(12) United States Patent
Geisberger et al.

(10) Patent No.: US 9,242,851 B2
(45) Date of Patent: Jan. 26, 2016

(54) MEMS DEVICE WITH DIFFERENTIAL VERTICAL SENSE ELECTRODES

(71) Applicants: Aaron A. Geisberger, Austin, TX (US); Margaret L. Kniffin, Chandler, AZ (US)

(72) Inventors: Aaron A. Geisberger, Austin, TX (US); Margaret L. Kniffin, Chandler, AZ (US)

(73) Assignee: FREESCALE SEMICONDUCTOR, INC, Austin, TX (US)

( * ) Notice: Subject to any disclaimer, the term of this patent is extended or adjusted under 35 U.S.C. 154(b) by 197 days.

(21) Appl. No.: 13/960,032

(22) Filed: Aug. 6, 2013

(65) Prior Publication Data

US 2015/0041927 A1 Feb. 12, 2015

(51) Int. Cl.
| | |
|---|---|
| *B81B 3/00* | (2006.01) |
| *B81C 1/00* | (2006.01) |
| *H01L 41/113* | (2006.01) |
| *G01P 15/125* | (2006.01) |
| *G01C 19/574* | (2012.01) |
| *G01P 15/08* | (2006.01) |

(52) U.S. Cl.
CPC ............ *B81B 3/0027* (2013.01); *B81B 3/0078* (2013.01); *B81C 1/0015* (2013.01); *G01C 19/574* (2013.01); *G01P 15/125* (2013.01); *H01L 41/113* (2013.01); *H01L 41/1136* (2013.01); *B81B 2201/025* (2013.01); *G01P 2015/0831* (2013.01)

(58) Field of Classification Search
CPC .. B81B 3/0027; B81C 1/0015; H01L 41/113; H01L 41/1136
See application file for complete search history.

(56) References Cited

U.S. PATENT DOCUMENTS

| 7,610,809 | B2 | 11/2009 | McNeil et al. |
|---|---|---|---|
| 8,138,007 | B2 | 3/2012 | Geisberger |
| 2008/0224319 | A1* | 9/2008 | Nakamura .......... B81C 1/00944 257/758 |
| 2008/0290430 | A1 | 11/2008 | Mahadevan et al. |
| 2009/0031809 | A1* | 2/2009 | Lin ....................... G01P 15/125 73/514.32 |
| 2009/0174014 | A1* | 7/2009 | Kunze ................... B81B 3/0024 257/415 |
| 2010/0212425 | A1 | 8/2010 | Hsu et al. |
| 2014/0015123 | A1* | 1/2014 | Bowles ................. B81C 1/0023 257/737 |
| 2014/0300249 | A1* | 10/2014 | Van Kampen ...... B81C 1/00039 310/300 |

OTHER PUBLICATIONS

Wang et al., A Novel CMOS Out-of-plane Accelerometer With Fully Differential Gap-closing Capacitance Sensing Electrodes, Journal of Micromechanics and Microengineering, pp. 1275-1280, 2007 IOP Publishing Ltd, United Kingdom.
Hsu et al., Implementation of a Gap-closing Differential Capacitive Sensing Z-axis Accelerometer on an SOI Wafer, Journal of Micromechanics and Microengineering, pp. 1-7, 2009 IOP Publishing Ltd, United Kingdom.

* cited by examiner

*Primary Examiner* — Joseph C Nicely
(74) *Attorney, Agent, or Firm* — Charlene R. Jacobsen

(57) ABSTRACT

A MEMS device includes a first sense electrode and a first portion of a sense mass formed in a first structural layer, where the first sense electrode is fixedly coupled with the substrate and the first portion of the sense mass is suspended over the substrate. The MEMS device further includes a second sense electrode and a second portion of the sense mass formed in a second structural layer. The second sense electrode is spaced apart from the first portion of the sense mass in a direction perpendicular to a surface of the substrate, and the second portion of the sense mass is spaced apart from the first sense electrode in the same direction. A junction is formed between the first and second portions of the sense mass so that they are coupled together and move concurrently in response to an imposed force.

20 Claims, 11 Drawing Sheets

US 9,242,851 B2

MEMS DEVICE WITH DIFFERENTIAL VERTICAL SENSE ELECTRODES

TECHNICAL FIELD OF THE DISCLOSURE

The present disclosure relates generally to microelectromechanical systems (MEMS) devices. More specifically, the present disclosure relates to MEMS devices with differential vertical sense electrodes for Z-axis sensing.

BACKGROUND OF THE DISCLOSURE

Microelectromechanical Systems (MEMS) sensor devices are widely used in applications such as automotive, inertial guidance systems, household appliances, protection systems for a variety of devices, and many other industrial, scientific, and engineering systems. Such MEMS devices are used to sense a physical condition such as acceleration, angular rate, pressure, or temperature, and to provide an electrical signal representative of the sensed physical condition. Capacitive-sensing MEMS sensor designs are highly desirable for operation in high gravity environments and in miniaturized devices, and due to their relatively low cost.

BRIEF DESCRIPTION OF THE DRAWINGS

A more complete understanding of the present disclosure may be derived by referring to the detailed description and claims when considered in connection with the Figures, wherein like reference numbers refer to similar items throughout the Figures, the Figures are not necessarily drawn to scale, and:

DETAILED DESCRIPTION

Figure 1:
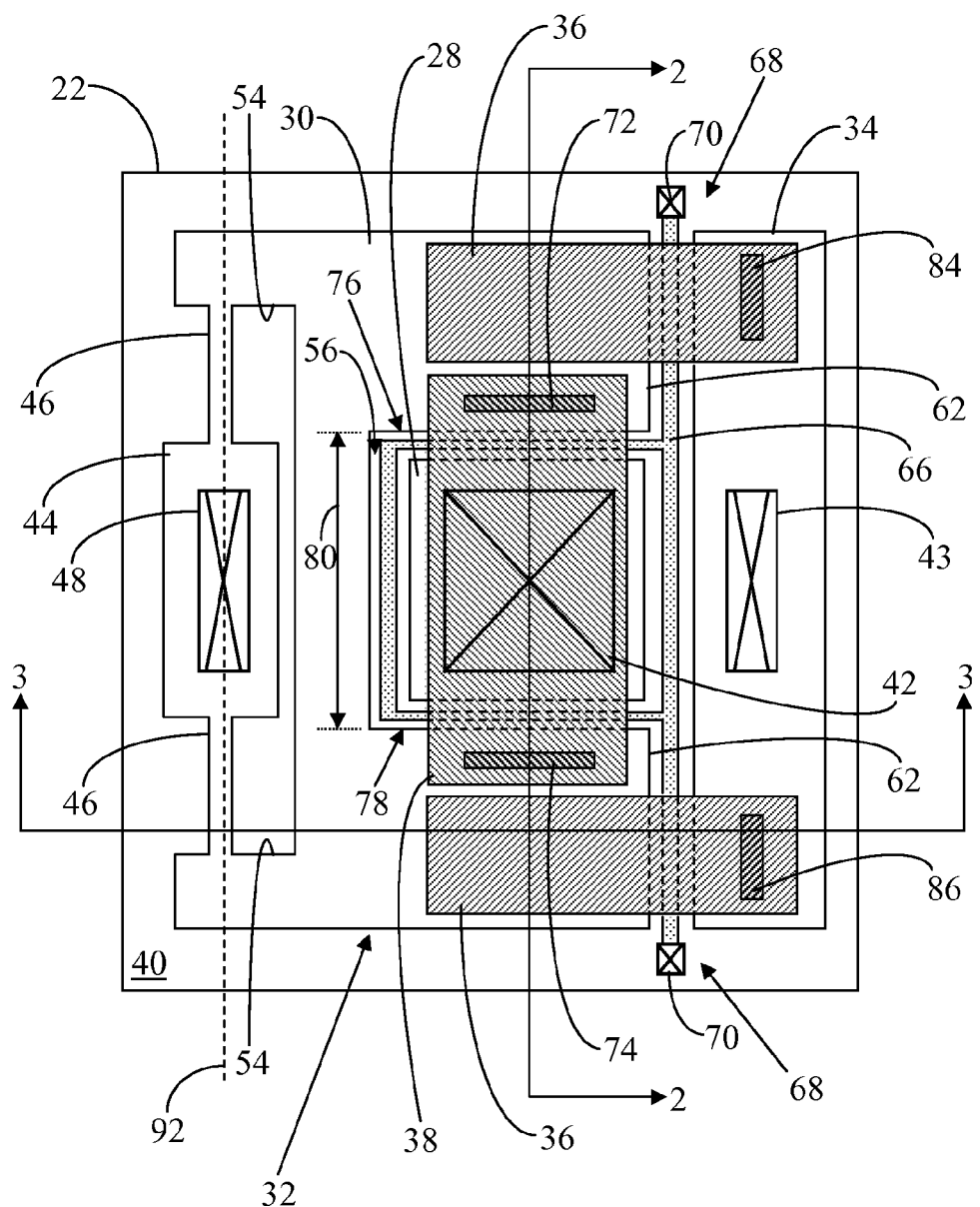
FIG. 1 schematically shows a top view of a MEMS device in accordance with an embodiment.

The fabrication and packaging of MEMS device applications, as well as stresses resulting from soldering the packaged MEMS device onto a printed circuit board in an end application, can cause the non-uniform stretching, bending, or warping across a surface of the substrate upon which the MEMS device is formed. Substrate curvature can cause changes in the sense signal, thus adversely affecting the output performance of the MEMS device.

A number of MEMS inertial sensors, such as accelerometer and angular rate sensor devices, implement vertical sensing, i.e., sensing that is perpendicular to the plane of the substrate. A commonly implemented structure for MEMS device vertical sensing is a "teeter-totter" sense mass configuration that is capable of rotating above a substrate under z-axis force. Fixed positive and negative sense electrodes can be arranged below the teeter-totter sense mass on opposing sides of an axis of rotation of the sense mass. The sense mass will tilt or rotate about the axis of rotation in response to a force, thus changing its position relative to the fixed sense electrodes. This change in position results in capacitance signals whose difference, i.e., a differential capacitance, is indicative of the force.

This style of vertical sensing can be problematic in that the size of the sense gaps between the sense mass and each of the sense electrodes are highly sensitive to substrate curvature because the sense electrodes are separated by a relatively long distance in the plane of the substrate. For example, the sense electrodes may be located on opposing sides of the axis of rotation. Secondly, the teeter-totter style of vertical sensing can result in common mode displacement, wherein the entire sense mass moves generally perpendicular to the plane of the substrate, instead of tilting. Since the sense gaps, i.e., one gap between the sense mass and the positive sense electrode and another gap between the sense mass and the negative sense electrode, are located on the same side of the sense mass, the common mode displacement can cause both the positive and the negative sense signals to change equally, resulting in no net differential signal. Thus, a change in the size of the sense gaps due to common mode displacement can introduce a scale factor change, and potentially adversely shift the sensitivity of the device. A change in the sense gap size due to common mode displacement can also alter the sense frequency of the device, essentially frequency tuning through electrostatic spring softening. In general, frequency tuning is a change in the resonant frequency of a sense oscillator, e.g., sense mass, due to an applied electrostatic force. Thus, the resonant frequency may change if the size of the gaps between the sense mass and the electrodes supplying the electrostatic force change. Thus, what is needed is a MEMS sensor device with a robust vertical sense electrode design that is less sensitive to substrate curvature and harsh accelerations.

Some embodiments disclosed herein entail microelectromechanical systems (MEMS) devices that include two structural layers, and junctions connecting elements of the two structural layers. The two structural layers are subsequently mechanically released, or detached, from the underlying substrate. Accordingly, a movable sense mass (a portion of which is formed in each of the two structural layers) is interleaved both below one fixed electrode and above a separate fixed electrode. This enables differential sensing such that any signal component resulting from the common mode displacement will effectively cancel. Another embodiment entails a method for fabricating the MEMS device using two structural layers, in which portions of the two structural layers are not in direct contact with the underlying substrate, and in which each structural layer has sense capability of an opposing polarity so as to provide a differential configuration.

Figure 2:
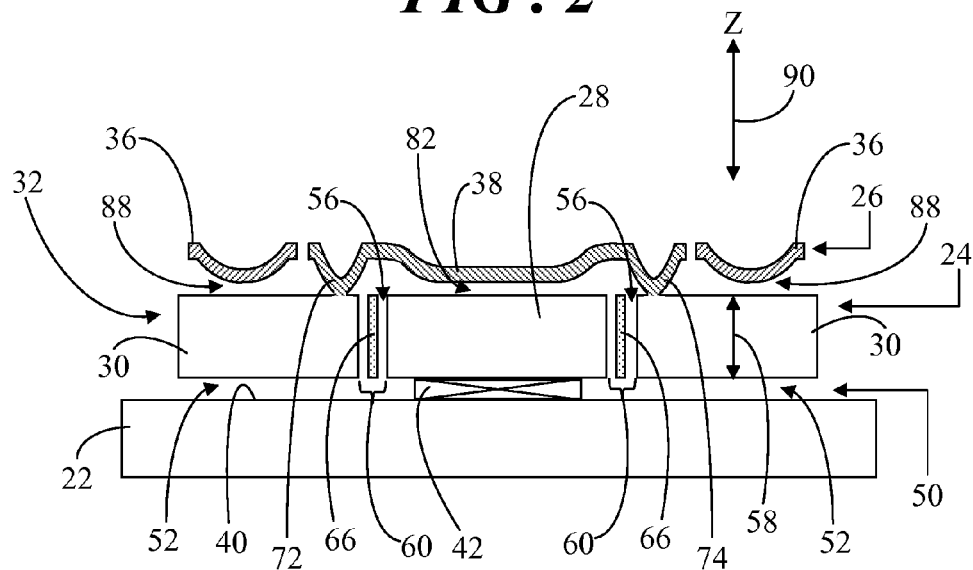
FIG. 2 shows a side view of the MEMS device along section line 2-2 shown in FIG. 1.
Figure 3:
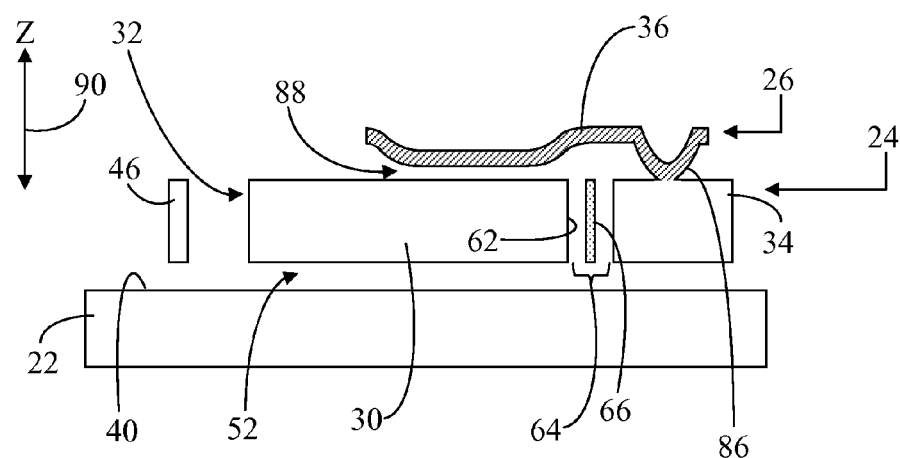
FIG. 3 shows a side view of the MEMS device along section line 3-3 shown in FIG. 1.

Referring now to FIGS. 1-3, FIG. 1 schematically shows a top view of a MEMS device 20 in accordance with an embodiment. FIG. 2 shows a side view of MEMS device 20 along section line 2-2, and FIG. 3 shows a side view of MEMS device 20 along section line 3-3. FIGS. 1-3 are illustrated using various shading and/or hatching to distinguish the different elements produced within the structural layers of MEMS device 20, as will be discussed below. These different elements within the structural layers may be produced utilizing current and upcoming surface micromachining techniques of depositing, patterning, etching, and so forth. Accordingly, although different shading and/or hatching is utilized in the illustrations, the different elements within the structural layers are typically formed out of the same material, such as polysilicon, single crystal silicon, and the like.

The elements of MEMS device 20 (discussed below) may be described variously as being "attached to," "attached with," "coupled to," "fixed to," or "interconnected with," other elements of MEMS device 20. However, it should be understood that the terms refer to the direct or indirect physical connections of particular elements of MEMS device 20 that occur during their formation through patterning and etching processes of MEMS fabrication, as will be discussed in connection with FIG. 9.

MEMS device 20 includes a substrate 22, a structural layer 24, and a structural layer 26 that is spaced apart from structural layer 24. A number of elements are formed in structural layer 24. In an embodiment, these elements include at least one sense electrode 28, a portion 30 of a movable sense mass 32, and a fixed element 34. Likewise, a number of elements are formed in structural layer 26. In an embodiment, these elements include at least one sense electrode 36 (two of which are shown) and another portion 38 of movable sense mass 32. Together, portions 30 and 38 form movable sense mass 32, as will be discussed in greater detail below. Sense electrodes 36 in structural layer 26 are represented by upwardly and rightwardly directed narrow hatching, and portion 38 of sense mass 32 in structural layer 26 is represented by downwardly and rightwardly directed narrow hatching to distinguish elements 36 and 38 in structural layer 26 from those elements formed in the underlying structural layer 24.

Sense electrode 28 in structural layer 24 is fixedly coupled to a surface 40 of substrate 22 by an anchor 42. Likewise, fixed element 34 in structural layer 24 is fixedly coupled to surface 40 of substrate 22 by an anchor 43. MEMS device 20 further includes an anchor element 44 and compliant members 46 formed in structural layer 24. Anchor element 44 is fixedly coupled to surface 40 of substrate 22 by an anchor 48, and compliant members 46 are interconnected between portion 30 of sense mass 32 and anchor element 44. Anchor 42 is depicted in FIGS. 1 and 2 by an "X" enclosed in a box to emphasize the attachment of a particular element, and in this case sense electrode 28, with the underlying substrate 22. Similarly, anchors 43 and 48 are depicted in FIG. 1 by an "X" enclosed in a box to emphasize the fixed attachment of fixed element 34 and anchor element 44 with the underlying substrate 22. In an embodiment, anchors 42, 43, and 48 may be formed when a portion of a sacrificial layer 50 remains beneath structural layer 24 following etching of sacrificial layer 50 during processing (discussed below).

In contrast to the fixed attachment of sense electrode 28, fixed element 34, and anchor element 44 with substrate 22, portion 30 of movable sense mass 32 in structural layer 24 is suspended over surface 40 of substrate 22 so that a gap 52 is present between surface 40 and portion 30 of sense mass 32. In an embodiment, compliant members 46 are connected to an outer edge 54 of portion 30 such that portion 30 of sense mass 32 is a cantilevered structure overlying surface 40 of substrate 22 that is supported only at one side.

Portion 30 of sense mass 32 further includes an opening 56 extending through a thickness 58 of portion 30, and sense electrode 28 resides within opening 56. Opening 56 is sized such that a gap 60 is formed between portion 30 and sense electrode 28. In some embodiments, opening 56 also extends laterally from an outer edge 62 of portion 30 such that portion 30 of sense mass 32 is a generally U-shaped member. Fixed element 34 is spaced away from outer edge 62 so that a gap 64 is also formed between fixed element 34 and the adjacent sense electrode 28 and portion 30 of sense mass 32.

In some embodiments, a shield 66 is located in gaps 60 and 62. Thus, shield 66 is interposed between sense electrode 28 and portion 30 of sense mass 32. Additionally, shield 66 is interposed between fixed element 34 and each of sense electrode 28 and portion 30 of sense mass 32. Shield 66 electrically isolates sense electrode 28 from the surrounding portion 30 of sense mass 32 to largely prevent motion sensitive capacitance from being created between portion 30 and sense electrode 28. Shield 66 is represented in FIGS. 1 and 3 by a stippled pattern to distinguish it from surrounding structures.

In some embodiments, shield 66 extends to an outside region 68 of MEMS device 20 and is coupled to corresponding shield anchors 70. Thus, shield 66 may be suspended over surface 40 of substrate 22. Again, shield anchors 70 are depicted in FIG. 1 by an "X" enclosed in a box to emphasize the fixed attachment of shield anchors 70 with the underlying substrate 22. Those skilled in the art will recognize that shield 66 and shield anchors 70 may be arranged differently than that which is shown.

Junctions 72, 74 are formed between portion 30 of sense mass 32 formed in structural layer 24 and portion 38 of sense mass 32 formed in structural layer 26. That is, junctions 72, 74 are structural features that couple, or join, portion 30 with portion 38 to form movable sense mass 32. Junction 72 is positioned on one side 76 of opening 56 and junction 74 is positioned on an opposing side 78 of opening 56. The pair of junctions 72, 74 couple portion 38 with portion 30 so that portion 38 of sense mass 32 spans across a width 80 of opening 56 and therefore overlies sense electrode 28. Junctions 72 and 74 extend above portion 30 of sense mass 32. As such, a sense gap 82 (visible in FIG. 2) is formed between portion 38 of sense mass 32 and the underlying sense electrode 28 and portion 38 of sense mass 32. In FIG. 1, junctions 72, 74 are depicted by dark downwardly and rightwardly directed narrow hatching to distinguish them from portion 38, as well as to emphasize their coupling between portions 30 and 38 to form sense mass 32.

Junctions 84, 86 are also formed between fixed element 34 formed in structural layer 24 and sense electrodes 36 formed in structural layer 26. That is, junctions 84, 86 are structural features that couple, or join, fixed element 34 with each of sense electrodes 36. In an embodiment, junction 84 couples fixed element 34 with one of sense electrodes 36, and junction 86 couples fixed element 34 with the other one of sense electrodes 36. Junctions 84, 86 extend above fixed element 34. As such, sense gaps 88 (one of which is visible in FIG. 3) is formed between the underlying portion 30 of sense mass 32 and each of sense electrodes 36. In FIG. 1, junctions 84, 86 are depicted by dark upwardly and rightwardly directed narrow hatching to distinguish them from sense electrodes 36, as well as to, emphasize their coupling between fixed element 34 and sense electrodes 36.

In the illustrated embodiment, MEMS device 20 may be an accelerometer having capacitive sensing capability. In general, compliant members 46 suspend sense mass 32 over substrate 22 in a neutral position generally parallel to substrate 22 until the selective application of force, due to some other means, causes a deflection thereof. By way of example, sense mass 32 of MEMS device 20 moves when MEMS device 20 experiences acceleration in a Z-direction 90 that is generally perpendicular to surface 40 of substrate 22. Accordingly, compliant members 46 enable sense mass 32 to rotate, or tilt, about an axis of rotation 92 that is offset away from portion 30 of sense mass 32. Since portions 30, 38 are coupled via junctions 72, 74, compliant members 46 enable concurrent movement of portions 30, 38 of sense mass 32. The tilting motion of sense mass 32 may be detected by sense electrodes 28, 38 interleaved with sense mass 32. This movement can subsequently be converted via electronics (not shown) into a signal having a parameter magnitude (e.g. voltage, current, frequency, etc.) that is dependent on the acceleration. In this example, MEMS device 20 may be a single axis accelerometer for detection of acceleration in Z-direction 90. However, alternative embodiments may entail dual axis accelerometers or other MEMS sensing devices.

Figure 4:
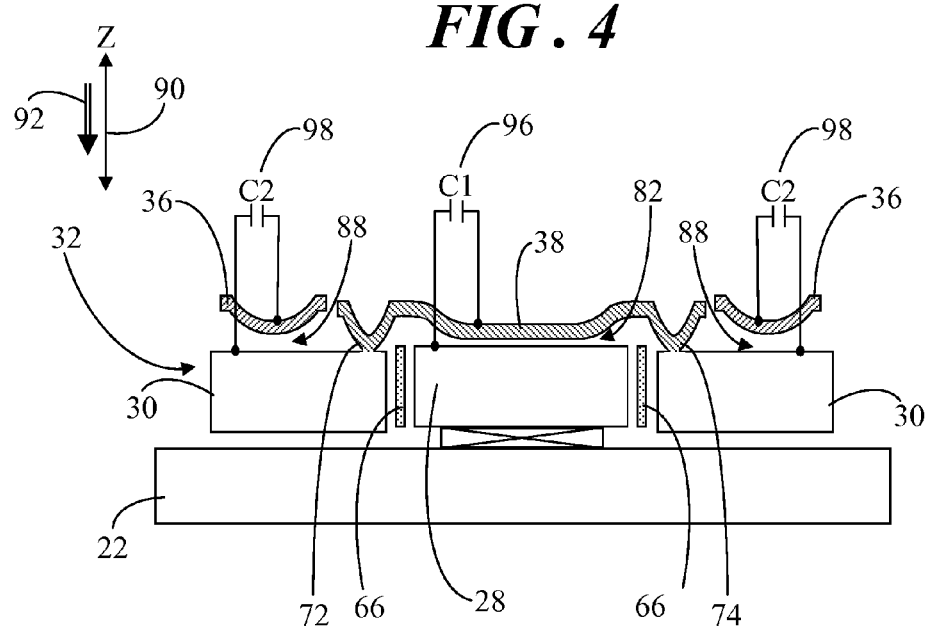
FIG. 4 shows a stylized side view of the MEMS device of FIG. 1 along section line 2-2 in which a movable element of the MEMS device has moved in response to an imposed force.
Figure 5:
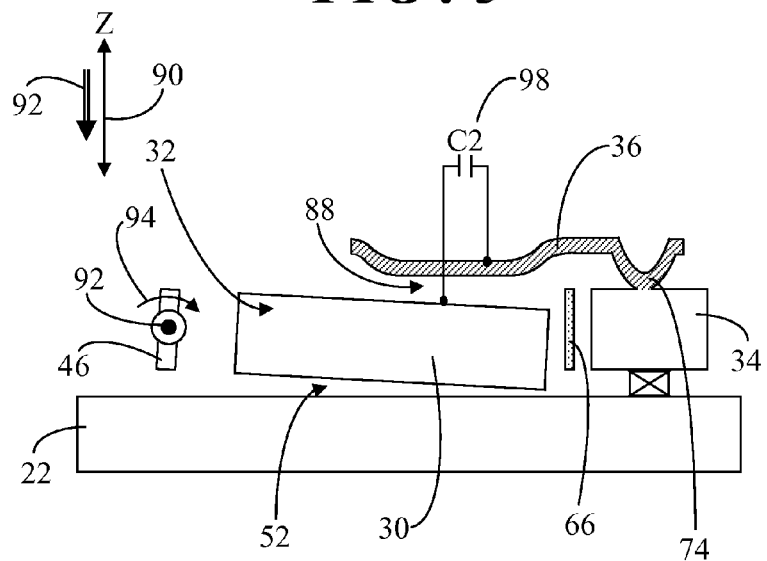
FIG. 5 shows a stylized side view of the MEMS device of FIG. 1 along section line 3-3 in which the movable element of the MEMS device has moved in response to an imposed force.

Referring to FIGS. 4-5, FIG. 4 shows a stylized side view of MEMS device 20 along section line 2-2 of FIG. 1 in which sense mass 32 has moved in response to an imposed force 92 in Z-direction 90. FIG. 5 shows a stylized side view of MEMS device 20 along section line 3-3 of FIG. 1 in which sense mass 32 of MEMS device 20 has moved in response to imposed force 92. Accordingly, FIGS. 4 and 5 represent a condition in which force 92 was sufficient to cause sense mass 32 to rotate about axis of rotation 92. This rotational motion is represented by an arrow 94 in FIG. 5 about axis of rotation 92, which is represented as a point in FIG. 5. Gap 52 below the suspended sense mass 32 provides the requisite space to allow for movement of sense mass 32. However, in some embodiments (not shown), it may be possible to form additional electrodes on surface 40 of substrate 22 to provide additional sensing or for other purposes such as shielding or control electrodes.

The particular formation of elements within the two structural layers 24, 26 and suitable connections of the elements via junctions 72, 74, 84, and 86 yields a structural configuration in which sense mass 32 is interleaved with sense electrodes 28, 36. That is, portion 30 of sense mass 32 is located below sense electrodes 36 and portion 38 of sense mass 30 is located above sense electrode 28 in Z-direction 90. Furthermore, sense electrodes 28, 36 are located on the same side of axis of rotation 92, with axis of rotation 92 being offset away from sense mass 32. Accordingly, when sense mass 32 rotates about axis of rotation 92, the width of sense gaps 82, 88 will change the same amount but in opposite directions.

In the illustrations of FIGS. 4 and 5, rotational motion (represented by arrow 94) of sense mass 32 resulting from the imposed force 92 causes sense gap 82 to get smaller and sense gap 88 to get larger. Therefore, a sense capacitance signal 96, labeled C1, between portion 38 of sense mass 32 and sense electrode 28 will decrease, and a sense capacitance signal 98, labeled C2, between portion 30 of sense mass 32 and sense electrodes 36 will increase. Accordingly, sense signals 96 and 98 are of opposite polarity. Furthermore, sense gaps 82 and 88 change by the same magnitude due to their location on the same side of axis of rotation 92 thus producing differential sensing and substantially reducing the electrostatic force imbalance generated from a bias voltage applied and common mode motion being induced through package deformations.

In addition, a vertical sense system in which sense gaps 82 and 88 are produced on the same side of axis of rotation 92 can alleviate the need for a traditional teeter-totter type sense mass for a Z-axis accelerometer. A traditional teeter-totter style sense mass may be less efficient in terms of size than the vertical sense system described above due to the need for inclusion of a "heavy side" of the sense mass. Accordingly, the vertical sense system of MEMS device 20 achieves savings in area relative to traditional teeter-totter style sense masses. Furthermore, since sense electrodes 28 and 36 are in close proximity to one another on the same side of axis of rotation 92 they can compensate for package stress through effective cancellation of signal component due to common mode displacement. Accordingly, the vertical sense system of MEMS device 20 provides a differential, robust, and space efficient design for accelerometers, angular rate sensors, or any of various sensors that have vertical sensing capability.

In alternative embodiments, the vertical sense system of MEMS device 20 may be implemented in a conventional teeter-totter sensor by adding the vertical sense system on both sides of the axis of rotation, with one of the sides including a heavy end. Such a teeter-totter structural configuration would have portions of sense capacitance signal 96 and sense capacitance signal 98 on both sides of the axis of rotation, and may be more immune to package deformations and common mode motions than a conventional teeter-totter sensor. Additionally, or alternatively, the configuration of an interleaved vertical sense system does not necessarily require a tipping or teeter-totter type of movable element, but could instead enable differential sensing in a pure vertical motion sensor in which the proof mass moves in a more trampoline-like motion.

Figure 6:
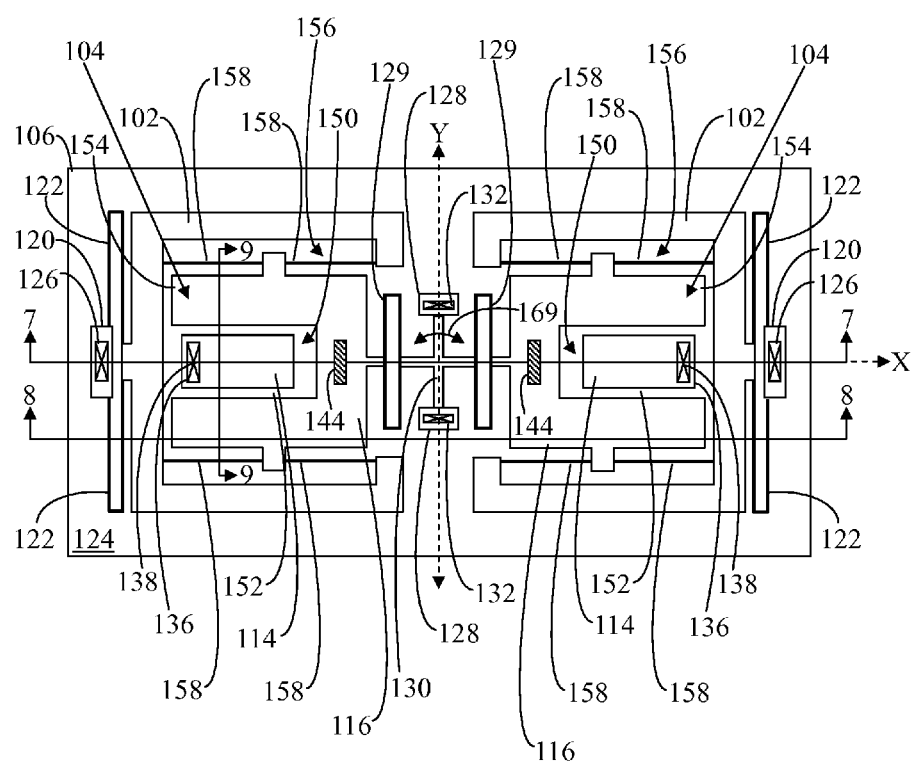
FIG. 6 shows a top view of a MEMS device in accordance with another embodiment.
Figure 7:
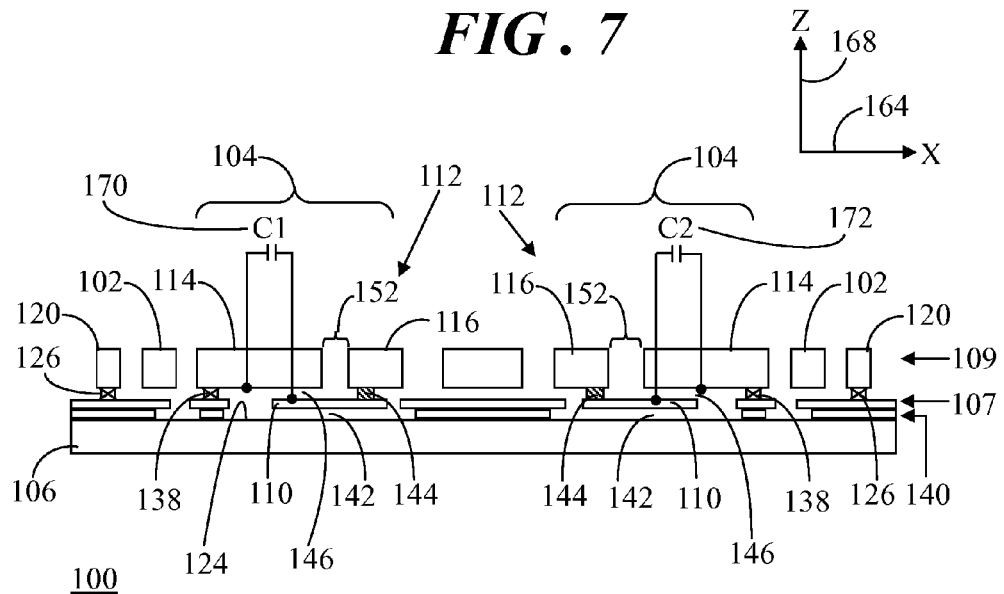
FIG. 7 shows a side view of the MEMS device along section line 7-7 shown in FIG. 6.
Figure 8:
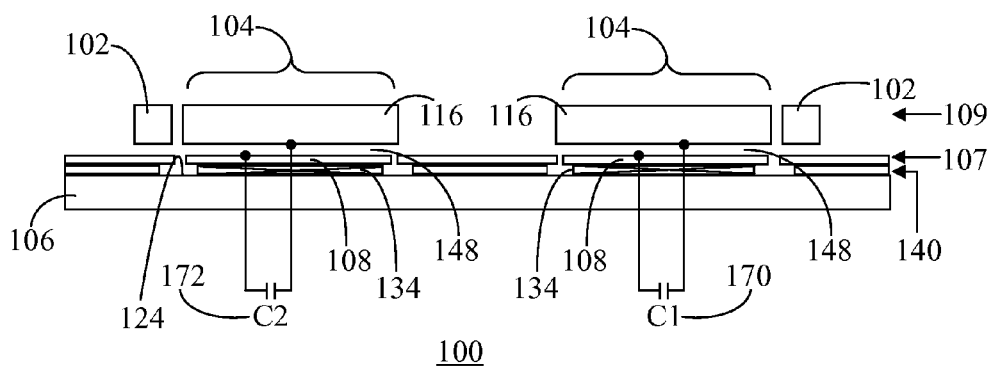
FIG. 8 shows a side view of the MEMS device along section line 8-8 shown in FIG. 6.
Figure 9:
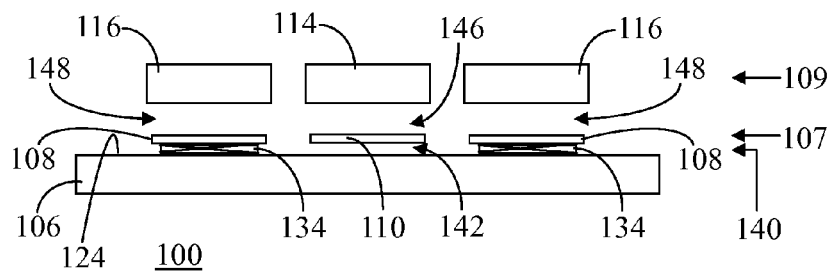
FIG. 9 shows a partial side view of the MEMS device along section line 9-9 shown in FIG. 6.

Referring now to FIGS. 6-9, FIG. 6 shows a top view of a MEMS device 100 in accordance with another embodiment. FIG. 7 shows a side view of MEMS device 100 along section line 7-7 of FIG. 6. FIG. 8 shows a side view of MEMS device 100 along section line 8-8 of FIG. 6, and FIG. 9 shows a partial side view of MEMS device 100 along section line 9-9 of FIG. 6. In an embodiment, MEMS device 100 implements a vertical sense system in an angular rate sensor, or gyroscope, configuration.

MEMS device 100 generally includes at least one drive mass 102 (two in the illustrated embodiment) and at least one vertical sensing structure 104 (two in the illustrated embodiment) spaced apart from an underlying substrate 106. A number of elements of each vertical sensing structure 104 are formed in each of two structural layers 107 and 109. In an embodiment, vertical sensing structure 104 includes at least one sense electrode 108 and a portion 110 of a movable sense mass 112 formed in structural layer 107, and at least one sense electrode 114 and another portion 116 of movable sense mass 112 formed in structural layer 109. Together, portions 110 and 116 form movable sense mass 112.

MEMS device 100 further includes anchor elements 120 and compliant members 122 formed in structural layer 109. Anchor elements 120 are fixedly coupled to a surface 124 of substrate 106 by an attachment material, referred to herein as an anchor 126, and compliant members 122 are interconnected between each of drive masses 102 and anchor elements 120. Anchors elements 126 are depicted in FIGS. 6 and 7 by an "X" enclosed in a box to emphasize the attachment of a particular element, and in this case drive masses 102 with the underlying substrate 106 via compliant members 122 and anchor elements 120. However, as shown, drive masses 102 are spaced apart from, i.e., suspended above, surface 124 of substrate 106.

In some embodiments, MEMS device 100 includes additional anchor elements 128, compliant members 129, and a beam in the form of a torsion flexure 130 formed in structural layer 109. Anchor elements 128 are fixedly coupled to surface 124 of substrate 106 by an attachment material, referred to herein as an anchor 132. Compliant members 129 are connected to the two vertical sense structures 104 and to torsion flexure 130. Compliant members 129 enable relatively large movement of sense masses 112 along X-axis 164. Torsion flexure 130 is spaced apart from substrate 106 and is interconnected between anchor elements 128. Torsion flexure 130 allows rotation of the suspended elements about Y-axis 162. Therefore, torsion flexure 130 enables rocking movement of sense masses 112 in response to angular velocity, as will be discussed in greater detail below. Again, anchors 132 are depicted in FIG. 6 by an "X" enclosed in a box to emphasize their attachment with the underlying substrate 106.

Now with regard to the elements of each vertical sensing structure 104, each of sense electrodes 108 in structural layer 107 is fixedly coupled to substrate 106 by an attachment material, referred to herein as an anchor 134. In addition, a fixed element region 136 of each sense electrode 114 is coupled to surface 124 of substrate 106 via an attachment material, referred to herein as an anchor 138. Thus, each of sense electrodes 114 formed in structural layer 109 is a cantilevered structure overlying surface 124 of substrate 106 that is supported only at one side. Again, anchors 134 and 138 are depicted in FIGS. 6, 8, and 9 by an "X" enclosed in a box to emphasize their fixed attachment with the underlying substrate 106. However, although fixed element region 136 is attached with the underlying substrate 106, the remainder of each of sense electrodes 114 is spaced apart from, i.e., suspended above substrate 106, as particularly evident in FIG. 7. In an embodiment, anchors 126, 132, 134, and 138 may be formed when a portion of a sacrificial layer 140 remains beneath structural layer 107 following etching of sacrificial layer 140 during processing (discussed below).

In contrast to the fixed attachment of sense electrodes 108 with substrate 106, portions 110 of sense masses 112 in structural layer 107 are suspended over surface 124 of substrate 106 so that gaps 142 (visible in FIGS. 7 and 9) are present between surface 124 and portions 110 of sense masses 112. Junctions 144 are formed between portions 110 of sense masses 112 formed in structural layer 107 and portions 116 of sense masses 112 formed in structural layer 109. That is, junctions 144 are structural features that couple, or join, portion portions 110 with portions 112 to form each of the two movable sense masses 112 of MEMS device 100. This structural feature is particularly visible in FIGS. 6 and 7 and is distinguished by rightwardly and downwardly directed narrow hatching. As such, sense gaps 146 (visible in FIGS. 7 and 9) are formed between sense electrodes 114 and the underlying portions 110 of sense masses 112. Additionally, sense gaps 148 (visible in FIGS. 8 and 9) are formed between portions 116 of sense mass 112 and the underlying sense electrodes 108.

As shown in FIG. 6, each portion 116 of each sense mass 112 includes an opening 150 extending through a thickness of each portion 116, and one of sense electrodes 114 resides within each opening 150. Like MEMS device 20 (FIG. 1), each opening 150 is sized such that a gap 152 is formed between each portion 116 and its corresponding sense electrode 114. Furthermore, in some embodiments, each opening 150 also extends laterally from an outer edge 154 of each portion 116 such that each portion 116 is a generally U-shaped member. Although not shown for simplicity, a shield may largely surround each of sense electrodes 114, as discussed in detail above in connection with shield 66 (FIG. 1).

In the illustrated embodiment, MEMS device 100 may be an angular rate sensor, also known as a gyroscope, having capacitive sensing capability. Each of drive masses 102 includes an opening 156 extending through a thickness of structural layer 109. One of portions 116 of one of sense masses 112 resides within each opening 156. Each portion 116 of each sense mass 112 may be coupled to an associated drive mass 102 via compliant members 158 that are fairly stiff in an X-direction but compliant in a Z-direction to allow each of sense masses 112 to tilt or rotate about an axis of rotation. Those skilled in the art will recognize that compliant members 158 may have great variation in size and shape from that which is stylistically shown in FIG. 6.

In an exemplary embodiment, MEMS device 100 is generally configured to sense angular rate when MEMS device 100 is subjected to angular velocity about the Y-axis in a three-dimensional coordinate system, referred to herein as an input axis 162. By convention, MEMS device 100 is illustrated as having a generally planar structure within an X-Y plane 166 defined by an X-axis 164 and Y-axis 162, wherein a Z-axis 168 extends out of the page, normal to X-Y plane 166 in FIG. 6 and Z-axis 168 extends upwardly and downwardly in FIGS. 7-9.

To operate MEMS device 100, a drive system (not shown) in communication with drive masses 102 enables linear mechanical oscillation of drive masses 102 within X-Y plane 166. Accordingly, drive masses 102 will linearly oscillate along, i.e. substantially parallel to X-axis 164. Sense masses 112 also linearly oscillate along X-axis 164 due to the high stiffness of compliant members 158 to this motion. The oscillatory drive motion may be kept constant to maintain constant sensitivity of MEMS device 100. Additionally or alternatively, the frequency of oscillation can be locked to the mechanical resonance of drive masses 102 to minimize drive power.

Once sense masses 112 are put into linear oscillatory motion along X-axis 164, they are capable of detecting an angular rate, i.e., angular velocity, induced by MEMS device 100 being rotated about input axis 162, i.e., the Y-axis. As MEMS device 100 experiences an angular velocity about input axis 162, sense masses 112 rock, tilt, rotate, or otherwise oscillate together about Y-axis 162 via torsion flexure 130, as represented by a bi-directional arrow 169. In this example, the out-of-plane sense motion of sense masses 112 is in the direction substantially parallel to Z-axis 168. Since portions 110 and 116 of sense mass 112 are coupled via junctions 144, torsion flexure 130 enables concurrent movement of portions 110 and 116 of sense mass 112. This movement can subsequently be converted via electronics (not shown) into a signal having a parameter magnitude (e.g., voltage, current, frequency, etc.) that is dependent upon the angular rotation rate of MEMS device 100 about input axis 164, i.e., the Y-axis.

The suitable formation of elements within the two structural layers 107 and 109 and suitable connection of portions 110 and 116 of sense masses 112 via junctions 144 yields a structural configuration in which sense mass 112 is interleaved with sense electrodes 108 and 114. That is, portions 110 of sense masses 112 are located below sense electrodes 114, and portions 116 of sense masses 112 are located above sense electrodes 108.

Accordingly, in FIG. 7, a sense capacitance signal 170, labeled C1, between portion 110 of sense mass 112 and sense electrode 114 will change by the same magnitude as a sense capacitance signal 172, labeled C2, between portion 112 of sense mass 112 and sense electrode 114. Likewise, in FIG. 8, sense capacitance signal 170, labeled C1, between portion 116 of sense mass 112 and sense electrode 108 will change by the same magnitude as sense capacitance signal 172, labeled C2, between portion 116 of sense mass 112 and sense electrode 108 due to their location on the same side of the axis of rotation, i.e., X-axis 164. However, sense signals 170 and 172 are of opposite polarity. Furthermore, sense gaps 146 and 148 change by the same magnitude due to their location on the same side of axis of rotation 162 thus producing differential sensing and cancellation of electrostatic forces from, for example, common mode displacement.

Figure 10:
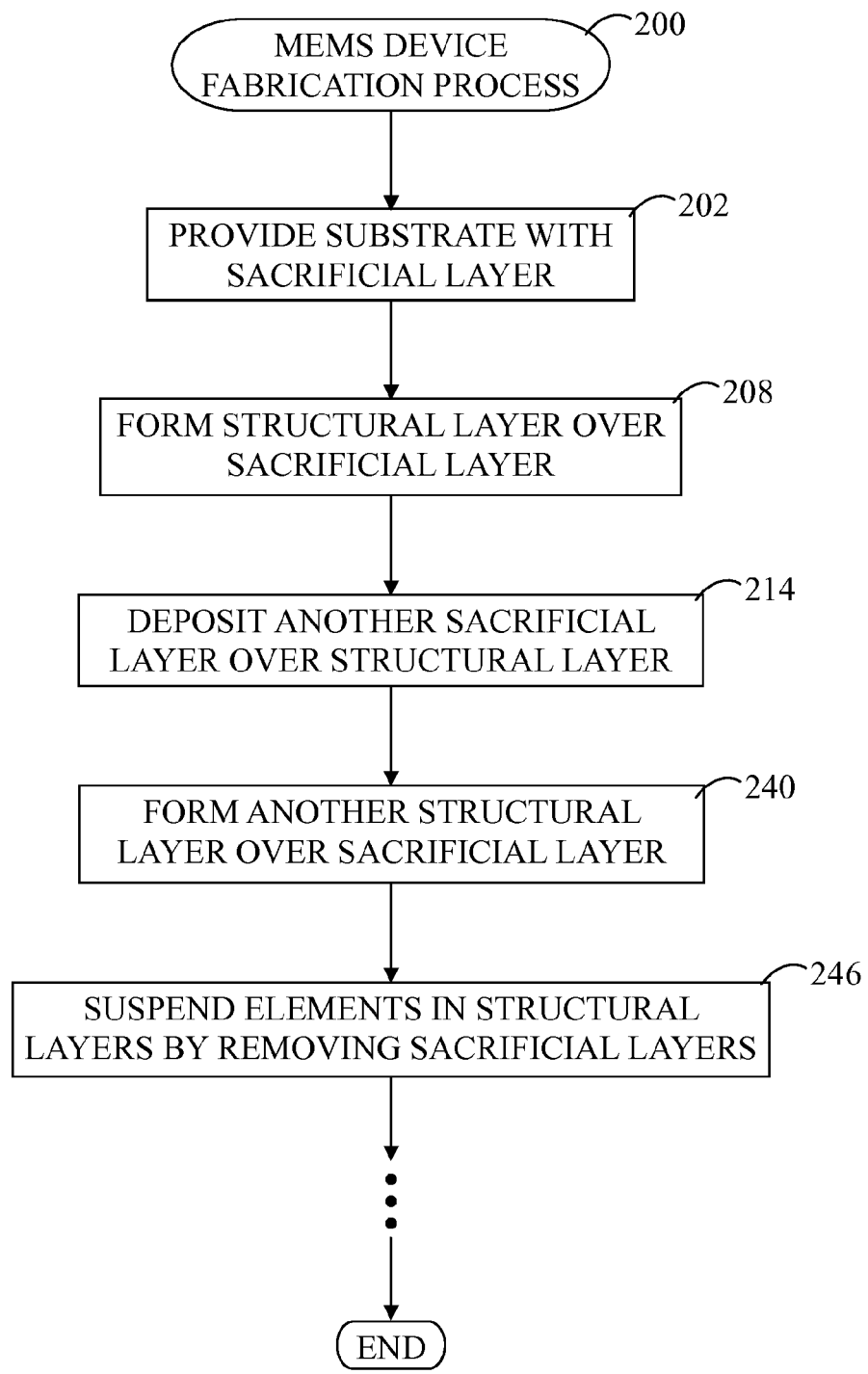
FIG. 10 shows a flowchart of a microelectromechanical systems (MEMS) device fabrication process in accordance with another embodiment.

FIG. 10 shows a flowchart of a microelectromechanical systems (MEMS) device fabrication process 200 in accordance with another embodiment. MEMS device fabrication process 200 provides generalized methodology for MEMS device 20 (FIG. 1) and/or MEMS device 100 (FIG. 6) using two structural layers to form a sense mass interleaved with the sense electrodes so as to produce a vertical differential sense capability. MEMS device fabrication process 200 will be discussed in connection with the fabrication of MEMS device 20, and reference will be made to FIGS. 11-19 which show a portion of an exemplary structure at various stages of fabrication in accordance with process 200. Thereafter, MEMS device fabrication process 200 will be discussed in connection with the fabrication of MEMS device 100, and reference will be made to FIGS. 20-26 which show a portion of another exemplary structure at various stages of fabrication in accordance with process 200. It should become apparent that the following methodology can be adapted to fabricate other MEMS device designs with vertical differential sense capability fabricated within two structural layers.

Fabrication process 200 is described below in connection with the fabrication of a single MEMS device 20 or 100 for simplicity of illustration. However, it should be understood by those skilled in the art that the following process allows for concurrent manufacturing of a plurality of MEMS devices. For example, multiple MEMS devices may undergo concurrent semiconductor thin-film manufacturing on a substrate. The individual MEMS devices can then be cut, or diced, in a conventional manner to provide individual MEMS devices that can be packaged and coupled onto a printed circuit board in an end application.

MEMS device fabrication process 200 begins with an activity 202. At activity 202, substrate 22 is provided with sacrificial layer 50 deposited thereon.

Figure 11:
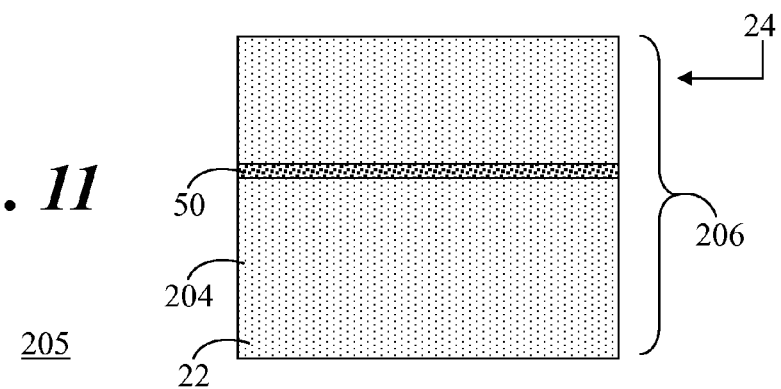
FIG. 11 shows a partial side view of an exemplary structure at a beginning stage of processing fabricated in accordance with the MEMS device fabrication process.

Referring to FIG. 11 in connection with activity 202, FIG. 11 shows a side view of an exemplary structure 204 in a beginning stage 205 of processing in accordance with activity 202. At beginning stage 205, substrate 22 is provided. In an embodiment, process 200 may implement silicon on insulator (SOI) technology which uses a layered silicon-insulator-silicon wafer 206 in lieu of a conventional silicon substrate. Accordingly, substrate 22 may be the bottommost silicon layer within wafer 206, sacrificial layer 50 may be the intervening insulator layer of wafer 206, and structural layer 24 may be the topmost silicon layer within wafer 206. Sacrificial layer 50 is represented by a dark stippled pattern in FIG. 11, and each of substrate 22 and structural layer 24 are represented by a light stippled pattern in FIG. 11. Those skilled in the art will recognize that in alternative embodiments, a conventional silicon substrate may be utilized for substrate 22, upon which sacrificial layer 50 may be deposited, followed by formation of structural layer 24 overlying sacrificial layer 50.

With reference back to MEMS device fabrication process 200 (FIG. 10), following activity 202, an activity 208 is performed. At activity 208, structural layer 24 (FIG. 2) is suitably formed over sacrificial layer 50 (FIG. 2) to produce at least sense electrode 28, portion 30 of sense mass 32, fixed element 34, anchor element 44, compliant members 46, and shield 66 (see FIG. 1) in structural layer 24.

Figure 12:
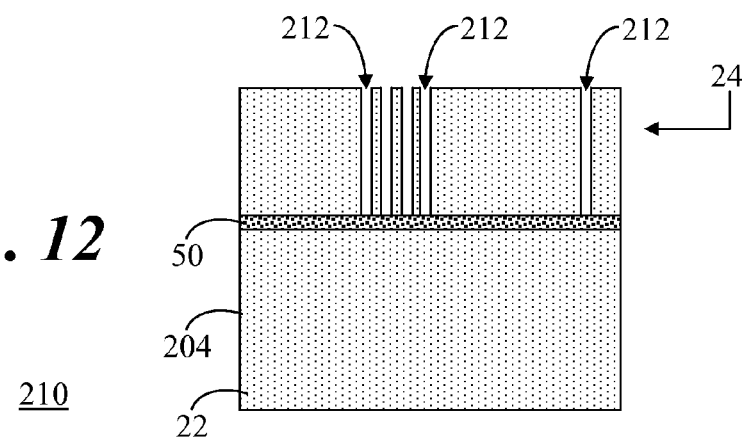
FIG. 12 shows a partial side view of the exemplary structure from FIG. 11 at a subsequent stage of processing.

FIG. 12 shows a partial side view of exemplary structure 204 from FIG. 10 at a subsequent stage 210 of processing. At stage 210, structural layer 24 is patterned and etched to produce trenches 212, or spaces, between regions of structural layer 24 that will eventually become sense electrode 28, portion 30 of sense mass 32, fixed element 34, anchor element 44, compliant members 46, and shield 66 (see FIG. 1). Patterning and etching process techniques, such as deep reactive ion etching (DRIE), yield trenches 212 that physically separate elements 28, 30, and 34, and 44 (FIG. 1) from one another. In this illustration, elements 28, 30, and 34, and 44 that may be produced in structural layer 24 are not distinguished from one another within exemplary structure 204. Rather, the light stippled patterned is used for structural layer 24 to distinguish it from the underlying sacrificial layer 50.

With reference back to MEMS device fabrication process 200 (FIG. 10), following activity 208, an activity 214 is performed. At activity 214, a sacrificial layer is deposited over structural layer 24.

Figure 13:
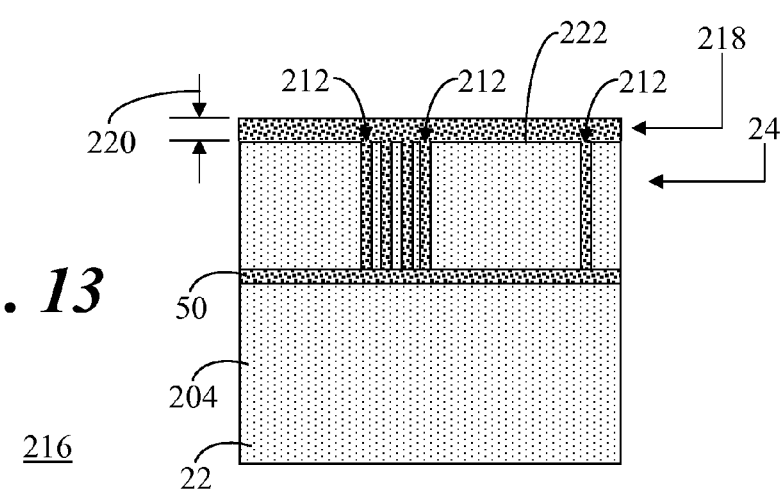
FIG. 13 shows a partial side view of the exemplary structure from FIG. 12 at a subsequent stage of processing.

Referring to FIG. 13 in connection with activity 214, FIG. 12 shows a partial side view of exemplary structure 204 from FIG. 12 at a subsequent stage 216 of processing. At stage 216, a sacrificial material 218 is deposited over structural layer 24 to fill trenches 212. Sacrificial material 218 is deposited such that a thickness 220 of material 218 extends above a surface 222 of structural layer 24. Sacrificial material 218 may be, for example, phosphosilicate glass (PSG). PSG is an electrically insulating material that is commonly used as a deposition layer in semiconductor processing. Those skilled in the art will recognize that other electrically insulating materials may alternatively be implemented.

Figure 14:
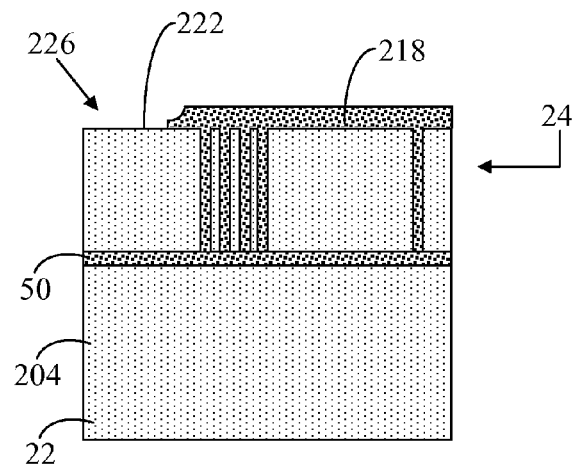
FIG. 14 shows a partial side view of the exemplary structure from FIG. 13 at a subsequent stage of processing.

Continuing with FIG. 14 in connection with activity 214 (FIG. 10), FIG. 14 shows a partial side view of exemplary structure 204 from FIG. 13 at a subsequent stage 224 of processing. In some embodiments, sacrificial material 218 may be suitably patterned and etched. As shown in FIG. 13, a region 226 of sacrificial material 218 has been etched to reveal surface 222 of structural layer 24. It will become apparent in subsequent operations that region 226 may be a location where an overlying element (e.g., sense electrode 36 of FIG. 1) may be formed at which tight tolerances are required for the size of the gap (e.g., sense gap 88 of FIG. 2) between it and an underlying element (e.g., portion 30 of sense mass 32 shown in FIG. 1).

Figure 15:
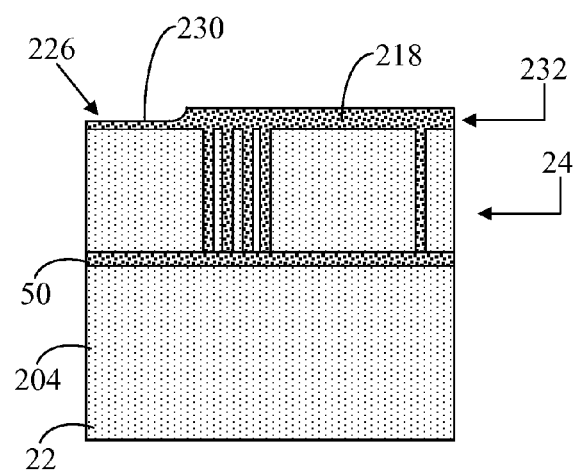
FIG. 15 shows a partial side view of the exemplary structure from FIG. 14 at a subsequent stage of processing.

Continuing with FIG. 15 in connection with activity 214 (FIG. 10), FIG. 15 shows a partial side view of exemplary structure 204 from FIG. 14 at a subsequent stage 228 of processing. At stage 228, another deposition process may be performed to deposit additional sacrificial material 230, such as PSG, onto surface 222 of structural layer 24 at region 226 and optionally onto sacrificial material 218. Sacrificial material 230 is deposited at a thickness suitable for achieving a predetermined size of the gap. Accordingly, at stage 228, a sacrificial layer 232 which may include the successive depositions of sacrificial material 218 and sacrificial material 230 is formed in accordance with activity 214 of MEMS device fabrication process 200 (FIG. 10).

Figure 16:
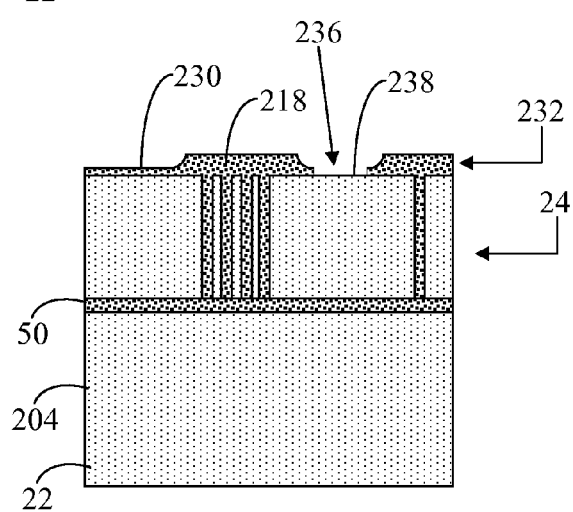
FIG. 16 shows a partial side view of the exemplary structure from FIG. 15 at a subsequent stage of processing.

Continuing with FIG. 16 in connection with activity 214 (FIG. 10), FIG. 16 shows a partial side view of exemplary structure 204 from FIG. 15 at a subsequent stage 234 of processing. At stage 234, sacrificial layer 232 may then be patterned and etched to create a number of openings 236 to expose regions 238 of the underlying elements. For example, openings 236 may be formed to expose regions 238 of portion 30 of sense mass 32 (FIG. 1) at which junctions 72, 74 (FIG. 1) are to be formed. Likewise, openings 236 may be formed to expose regions 238 of fixed element 34 (FIG. 1) at which junctions 84, 86 are to be formed.

With reference back to MEMS device fabrication process 200 (FIG. 10), following activity 214, an activity 240 is performed. At activity 240, structural layer 26 (FIG. 2) is formed over sacrificial layer 232 (FIG. 15) to produce at least sense elements 36, portion 38 of sense mass 32, and junctions 72, 74, 84, 86 (see FIG. 1).

Figure 17:
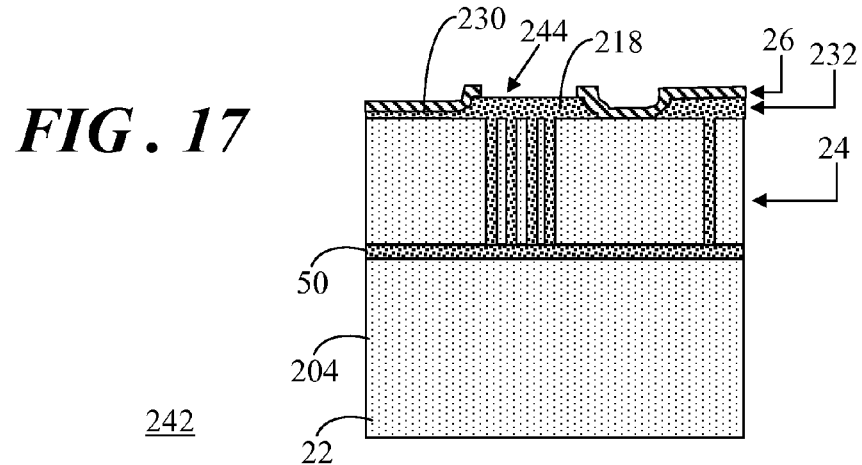
FIG. 17 shows a partial side view of the exemplary structure of FIG. 16 at a subsequent stage of processing.

Referring to FIG. 17 in connection with activity 240, FIG. 17 shows a partial side view of exemplary structure 204 from FIG. 16 at a subsequent stage 242 of processing. At stage 242, another layer of material such as polysilicon is deposited on sacrificial layer 232 to form structural layer 26. The deposition of structural layer 26 fills openings 236 in sacrificial layer 232 to create junctions 72, 74, 84, 86 (FIGS. 1-3). FIG. 17 further shows that at stage 242, structural layer 26 may be suitably patterned and etched to produce the separate elements in structural layer 26, such as sense elements 36 and portion 38 of sense mass 32. Interconnects (not shown) can be included as necessary. Patterning and etching process techniques of activity 240 yield spaces 244 that physically separate sense elements and portion 38 from one another. In this illustration, elements 36 and 38, and junctions 72, 74, 84, 86 are not distinguished from one another. Rather, a single rightwardly and downwardly directed wide hatch pattern is utilized to represent the elements of structural layer 26.

With reference back to MEMS device fabrication process 200 (FIG. 10), following activity 240, an activity 246 is performed. At activity 246, the elements in structural layers 24 and 26 are suspended over substrate 22 by removing at least portions of sacrificial layers 50 and 232 by employing, for example, one or more etching processes.

Figure 18:
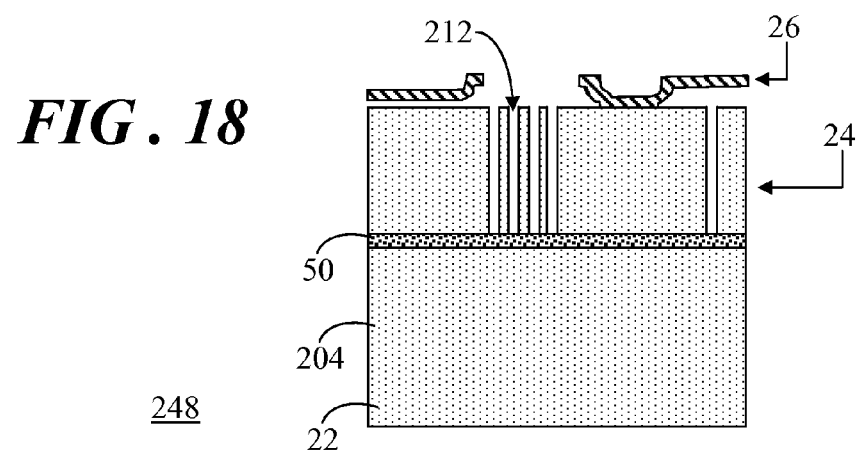
FIG. 18 shows a partial side view of the exemplary structure from FIG. 17 at a subsequent stage of processing.

Referring to FIG. 18 in connection with activity 246, FIG. 18 shows a partial side view of exemplary structure 204 from FIG. 17 at a subsequent stage 248 of processing. At stage 248, sacrificial layer 232 (FIG. 17), which may be PSG, is etched using known processes to remove sacrificial material 218, 232 underlying elements (e.g., sense electrodes 36 and portion 38 of sense mass 32, FIGS. 1-3) of structural layer 26 and to remove sacrificial material 218 (FIG. 17) from trenches 212. Although not shown, shield 66 may be suitably formed in trenches 212 using a dielectric. Alternatively, shield 66 may be formed from sacrificial material 218 (e.g., PSG) using known processes. In an example, some of sacrificial material 218 used to form shield 66 may be suitably masked so that it remains following etching at activity 246.

Accordingly, following removal of sacrificial material 218, 232 and sense electrodes 36 and portion 38 of sense mass 32 are spaced apart from the underlying elements of structural layer 24, with only junctions 72, 74, 84, and 86 remaining to form the structural connections, as discussed above in connection with FIGS. 1-3 between structural layers 24 and 26. Therefore, junctions 72, 74, 84, and 86, may be referred to as "released junctions" because they are released from the surrounding sacrificial material 218, 230.

Figure 19:
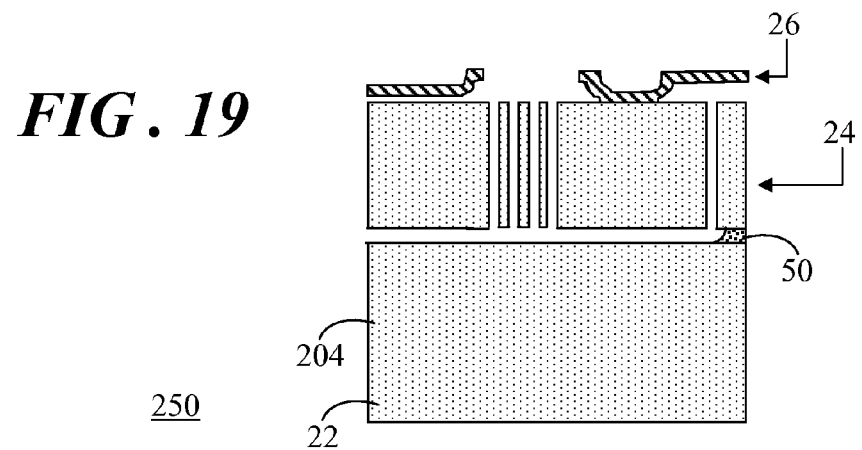
FIG. 19 shows a partial side view of the exemplary structure from FIG. 18 at a subsequent stage of processing.

Continuing with FIG. 19 in connection with activity 246, FIG. 19 shows a partial side view of exemplary structure 204 from FIG. 18 at a subsequent stage 250 of processing. When substrate 22, sacrificial layer 50, and structural layer 24 are formed as SOI wafer 206 (FIG. 10), one or more etch processes may be performed to remove at least a portion of the oxide material that makes up sacrificial layer 50. Thermal oxide removal of sacrificial layer 50 may be performed using known processes so as to release connection of the elements in structural layer 24 from the underlying substrate 22. Accordingly, following thermal oxide removal, sense electrode 28, portion 30 of sense mass 32, fixed element 34, anchor element 44, and compliant members 46 (FIGS. 1-3) are separated from one another and spaced apart from surface 40 of substrate 22. However, in an embodiment, sacrificial layer 50 remains at anchors 42, 43, 48, and 70 (FIGS. 1-3) so that sense mass 32, anchor regions 44, fixed element 34, and shield are attached to, but suspended above, substrate 22.

The selective removal of sacrificial layers 232 and 50 can be achieved by making certain regions of structural layers 24 and 26 porous to an etch material, or etchant. This porosity may be accomplished by fabricating first and second structural layers 24 and 26 with through-holes (not shown for simplicity of illustration) at suitable locations. The through-holes can provide passage through which an etchant can pass to reach the underlying sacrificial layers 232 (FIG. 17) and 50. Of course, through-holes need not be fabricated through at least structural layer 24 at the regions at which anchors 42, 43, 48, and 70 are formed so that sacrificial layer 50 that underlies those regions will remain following a suitably timed etching process. This porosity may alternatively be accomplished by the properties of the material used to fabricate structural layers 24 and 26. For example, the properties of the material used to fabricate structural layers 24 and 26 may be such that the etchant can permeate through the material of structural layers 24 and 26 to reach the underlying sacrificial layers 232 and 50 without damage to structural layers 24 and 26.

With reference back to MEMS device fabrication process 200 (FIG. 9), following activity 246, MEMS device fabrication process 200 may include other activities that are not discussed herein for brevity. These additional fabrication activities, represented by ellipses, may include hermetically sealing MEMS device 20 (FIG. 1), forming electrical interconnects, testing, and so forth. Following fabrication of MEMS device 20, fabrication process 200 ends with portion 38 connected to portion 30 of sense mass 32 via junctions 72, 74, and sense electrodes 36 connected to fixed element 34 via junctions 84 and 86 so that the two portions 30, 38 of sense mass 32 are in an interleaved arrangement with sense electrodes 28, 36 (FIGS. 1-3). Additionally, sense mass 32, fixed element 34, and shield 66 are connected to and held suspended above the underlying substrate 22 via respective anchors 48, 43, and 70.

Referring to FIG. 10, MEMS device fabrication process 100 will now be discussed in connection with the fabrication of MEMS device 100 (FIG. 6). At activity 202 of process 100, substrate 106 is provided with sacrificial layer 140 deposited thereon.

Figure 20:
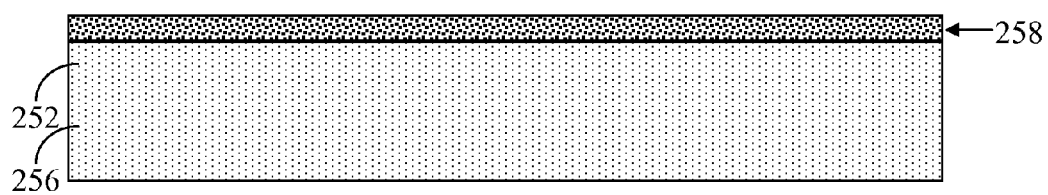
FIG. 20 shows a partial side view of another exemplary structure at a beginning stage of processing fabricated in accordance with the MEMS device fabrication process.

With reference to FIG. 20 in connection with activity 202, FIG. 20 shows a partial side view of another exemplary structure 252 at a beginning stage 254 of processing fabricated in accordance with MEMS device fabrication process 200. At beginning stage 254, a substrate 256, as a starting wafer, is provided. Substrate 256 may undergo an oxidation process to build, or grow, an oxide layer. This oxide layer is a sacrificial layer 258. Sacrificial layer 258 is represented by a dark stippled pattern and substrate 106 is represented by a light stippled pattern in FIG. 20. As will become evident in the subsequent description, substrate 256 will eventually become structural layer 109 (FIGS. 7-9) of MEMS device 100.

Figure 21:
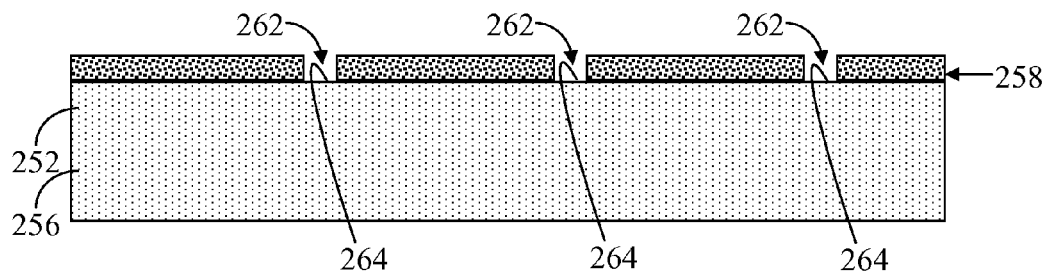
FIG. 21 shows a partial side view of the exemplary structure from FIG. 20 at a subsequent stage of processing.

Continuing with FIG. 21 in connection with activity 202, FIG. 21 shows a partial side view of exemplary structure 252 from FIG. 20 at a subsequent stage 260 of processing. In some embodiments, sacrificial layer 258 may be suitably patterned and etched. As shown in FIG. 21, openings 262, or vias, have been formed extending through sacrificial layer 258 to reveal a surface 264 of the underlying substrate 256. Thus, following activity 202, substrate 256 is provided with sacrificial layer 258 that may be patterned and etched to form openings 262.

With reference back to MEMS device fabrication process 200 (FIG. 10), following activity 202, activity 208 is performed to form a structural layer over the sacrificial layer to produce at least portions 110 of sense masses 112 and sense electrodes 108 (FIGS. 7-9).

Figure 22:
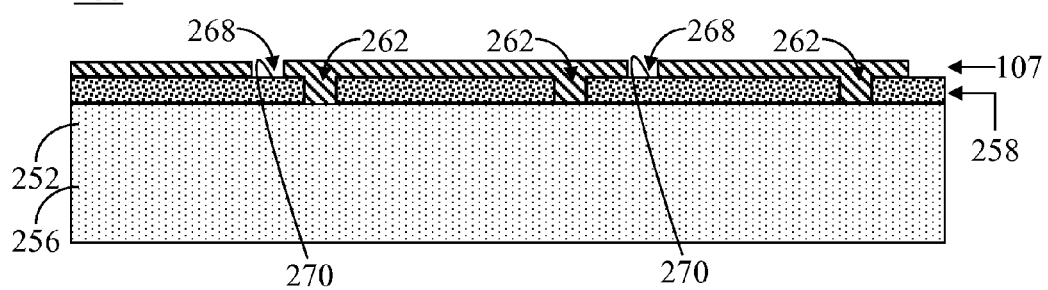
FIG. 22 shows a partial side view of the exemplary structure from FIG. 21 at a subsequent stage of processing.

FIG. 22 shows a partial side view of exemplary structure 252 from FIG. 21 at a subsequent stage 266 of processing. As shown in FIG. 22, structural layer 107 in the form of, for example, polysilicon, is deposited over sacrificial layer 258. Deposition of the polysilicon structural layer 107 fills openings 262. Structural layer 107 may be suitably patterned and etched. As shown, openings 268 have been formed extending through structural layer 107 to reveal a surface 270 of the underlying sacrificial layer 258. Thus, following activity 208, structural layer 107 is deposited and processed to include openings 268 that physically separate elements 108 and 110 (FIGS. 6-9) from one another. In this illustration, elements 108 and 110 that may be produced in structural layer 107 are not distinguished from one another within exemplary structure 252. Rather, the rightwardly and downwardly directed wide hatching is used for structural layer 107 to distinguish it from the underlying sacrificial layer 140.

Referring briefly to MEMS device fabrication process 200 (FIG. 10), following activity 208, activity 214 is performed to deposit a sacrificial layer over structural layer 107.

Figure 23:
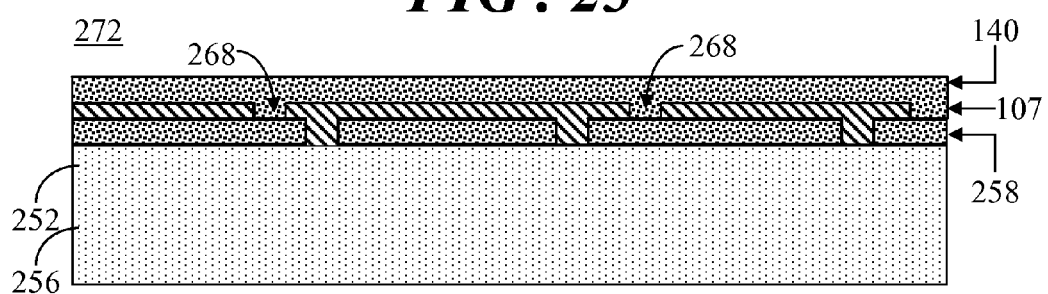
FIG. 23 shows a partial side view of the exemplary structure from FIG. 22 at a subsequent stage of processing.

FIG. 23 shows a partial side view of exemplary structure 252 from FIG. 22 at a subsequent stage 272 of processing. At stage 272, a sacrificial material, such as an oxide, is deposited over structural layer 107. As will become evident in the subsequent description, this sacrificial material will eventually be sacrificial layer 140 (FIGS. 7-9) of MEMS device 100. Sacrificial material 140 may be of sufficient thickness to fill openings 264.

Again, referring briefly to MEMS device fabrication process 200 (FIG. 10), following activity 214, activity 240 is performed to form another structural layer.

Figure 24:
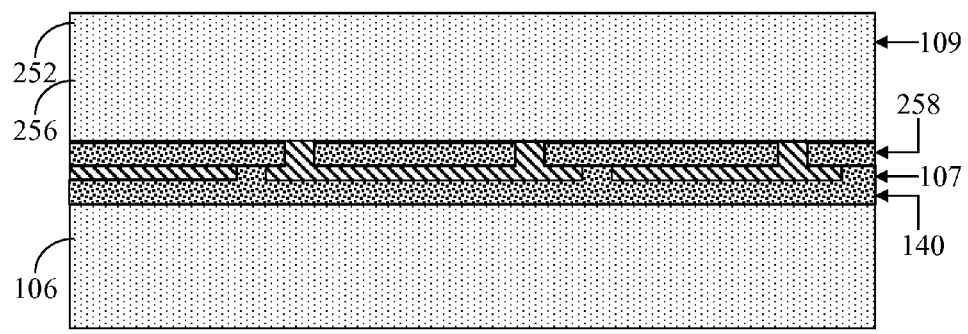
FIG. 24 shows a partial side view of the exemplary structure from FIG. 23 at a subsequent stage of processing.

FIG. 24 shows a partial side view of exemplary structure 252 from FIG. 23 at a subsequent stage 274 of processing. At stage 274, the structure formed at stage 272 (FIG. 23 is flipped and bonded to a substrate. In this exemplary embodiment, the substrate is substrate 106 of MEMS device 100 (FIG. 6).

Figure 25:
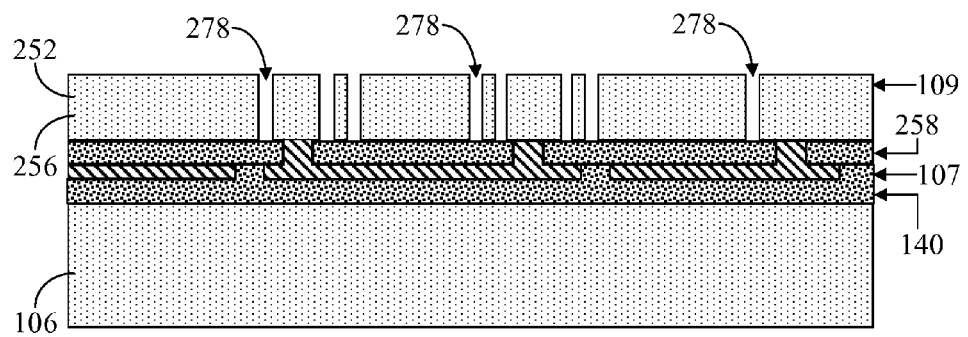
FIG. 25 shows a partial side view of the exemplary structure from FIG. 24 at a subsequent stage of processing.

Continuing with FIG. 25 in connection with activity 240, FIG. 25 shows a partial side view of exemplary structure 252 from FIG. 24 at a subsequent stage 276 of processing. At stage 276, structural layer 109 is processed by, for example, grinding, patterning, and etching to form at least portions 116 of sense masses 112, sense elements 114, anchor elements 120, and so forth (FIGS. 6-9). Patterning and etching process techniques, such as deep reactive ion etching (DRIE), yield trenches 278 that physically separate elements 116, 114, and 120 from one another. In this illustration, elements 116, 114, and 120 that may be produced in structural layer 109 are not distinguished from one another within exemplary structure 252. Rather, the light stippled patterned is used for structural layer 109 to distinguish it from the underlying sacrificial layer 258. Thus, following activity 240 (FIG. 10), elements 116, 114, and 120 have been formed and are physically separated from one another.

Referring briefly to MEMS device fabrication process 200 (FIG. 10), following activity 240, activity 246 is performed to suspend the various elements of MEMS device 100 (FIG. 6) formed in structural layers 107 and 109 by removing at least portions of sacrificial layers 258 and 140.

Figure 26:
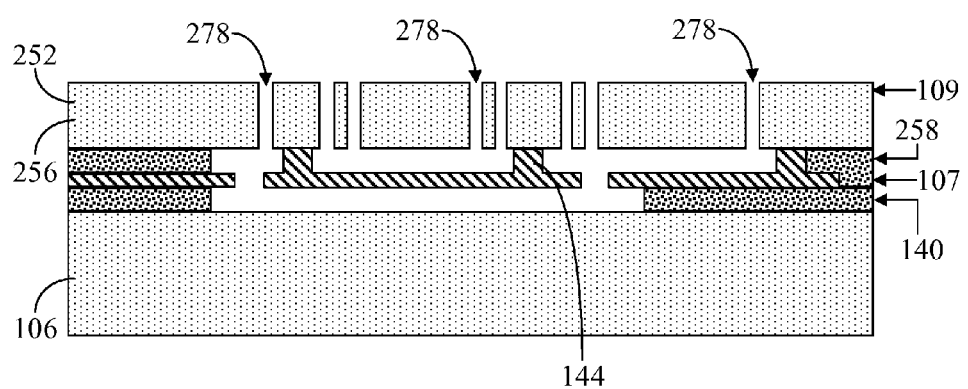
FIG. 26 shows a partial side view of the exemplary structure from FIG. 25 at a subsequent stage of processing.

FIG. 26 shows a partial side view of exemplary structure 252 from FIG. 25 at a subsequent stage 280 of processing. At stage 280, sacrificial layers 258 and 140 are etched using one or more known processes to remove sacrificial material 140, 258 underlying certain elements (e.g., sense electrodes 108 and 114, portions 110 and 116 of sense masses 112, and so forth). Accordingly, following removal of sacrificial material 140, 258, sense electrodes 114 and portions 116 of sense masses 112 are spaced apart from the underlying elements of structural layer 107. Additionally, portions 110 of sense masses 112 are spaced apart from the underlying substrate 106. However, junctions 144 remain to form the structural connections between portions 110 and 116 of sense masses 112, as discussed above in connection with FIGS. 6-9. Therefore, junctions 144 may be referred to as "released junctions" because they are released from the surrounding sacrificial material 140, 258.

Although particular system configurations are described in conjunction with FIGS. 11-26, above, embodiments may be implemented in systems having other architectures, as well. Furthermore, it is to be understood that certain ones of the process blocks depicted in FIG. 10 may be performed in parallel with each other or with performing other processes. In addition, it is to be understood that the particular ordering of the process blocks depicted in FIG. 10 may be modified, while achieving substantially the same result. Accordingly, such modifications and other variations are intended to be included within the scope of the inventive subject matter.

Thus, various embodiments of a MEMS device having vertical sensing capability and methods of fabrication have been described. The MEMS devices include two structural layers, and junctions connecting elements of the two structural layers. The two structural layers are subsequently mechanically released, or detached, from the underlying substrate. Accordingly, a movable sense mass (a portion of which is formed in each of the two structural layers) is interleaved both below one fixed electrode and above a separate fixed electrode. This enables differential sensing such that any signal component resulting from the common mode displacement will effectively cancel. Methodology entails fabricating the MEMS device using two structural layers, in which portions of the two structural layers are not in direct contact with the underlying substrate, and in which each structural layer has sense capability of an opposing polarity so as to provide a differential configuration.

An embodiment of a MEMS device comprises a substrate, and a first element and a second element formed in a first structural layer. The first element is fixedly coupled with the substrate, and the second element is suspended over the substrate. The MEMS device further comprises a third element and a fourth element formed in a second structural layer. The third element is spaced apart from the second element in a direction perpendicular to a surface of the substrate, and the fourth element is spaced apart from the first element in the direction. A junction is formed between the second element and the fourth element, the junction coupling the fourth element with the second element.

An embodiment of a method for fabricating a MEMS device is also disclosed. The method comprises forming a first structural layer on a first sacrificial layer overlying a substrate to produce first and second elements separated from one another, depositing a second sacrificial layer over the first structural layer, and forming a second structural layer over the second sacrificial layer to produce third and fourth elements separated from one another. The method further comprises forming at least one junction between the second element and the fourth element and suspending the second, third, and fourth elements over the substrate by removing at least portions of the first and second sacrificial layers, wherein the third element is spaced apart from the second element in a direction perpendicular to a surface of the substrate, the fourth element is spaced apart from the first element in the direction, and the fourth element is coupled with the second element via the at least one junction.

While the principles of the inventive subject matter have been described above in connection with specific systems, apparatus, and methods, it is to be clearly understood that this description is made only by way of example and not as a limitation on the scope of the inventive subject matter. The various functions or processing blocks discussed herein and illustrated in the Figures may be implemented in hardware, firmware, software or any combination thereof. Further, the phraseology or terminology employed herein is for the purpose of description and not of limitation.

The foregoing description of specific embodiments reveals the general nature of the inventive subject matter sufficiently so that others can, by applying current knowledge, readily modify and/or adapt it for various applications without departing from the general concept. Therefore, such adaptations and modifications are within the meaning and range of equivalents of the disclosed embodiments. The inventive subject matter embraces all such alternatives, modifications, equivalents, and variations as fall within the spirit and broad scope of the appended claims.

What is claimed is:

1. A microelectromechanical systems (MEMS) device comprising:
    a substrate;
    a first element and a second element formed in a first structural layer, said first element being fixedly coupled with said substrate, and said second element being suspended over said substrate;
    a third element and a fourth element formed in a second structural layer, said third element being spaced apart from said second element in a direction perpendicular to a surface of said substrate, and said fourth element being spaced apart from said first element in said direction; and
    a junction formed between said second element and said fourth element, said junction coupling said fourth element with said second element.

2. A MEMS device as claimed in claim 1 further comprising:
    an anchor attached to said substrate; and
    a compliant member interconnected between said second element and said anchor to allow concurrent movement of said second and fourth elements relative to said substrate.

3. A MEMS device as claimed in claim 2 wherein said compliant member is connected at an outer edge of said second element such that said second element is a cantilevered structure.

4. A MEMS device as claimed in claim 2 wherein said compliant member enables rotational movement of said second and fourth elements about an axis of rotation that is offset away from said second element.

5. A MEMS device as claimed in claim 1 wherein said second element includes an opening extending through a thickness of said second element, and said first element resides in said opening.

6. A MEMS device as claimed in claim 5 wherein said opening extends laterally from an outer edge of said second element such that said second element is a U-shaped member.

7. A MEMS device as claimed in claim 5 wherein said junction comprises:
    a first junction element positioned at a first side of said opening; and
    a second junction element positioned at a second side of said opening, said first and second junction elements coupling said fourth element with said second element so that said fourth element spans across a width of said opening.

8. A MEMS device as claimed in claim 1 further comprising a shield interposed between said first element and said second element, said shield being configured to electrically isolate said first element from said second element.

9. A MEMS device as claimed in claim 8 further comprising a shield anchor attached to said substrate and coupled to said shield so that said shield is suspended over said substrate.

10. A MEMS device as claimed in claim 1 wherein said junction is a first junction, and said MEMS device further comprises:
    a fifth element formed in said first structural layer and fixedly coupled with said substrate; and
    a second junction formed between said third element and said fifth element, said second junction coupling said third element with said fifth element.

11. A MEMS device as claimed in claim 10 wherein:
    said fifth element is displaced away from said first and second elements in a lateral direction that is approximately parallel to a surface of said substrate; and
    said MEMS device further comprises a shield interposed between said fifth element and said first and second elements, said shield being configured to electrically isolate said fifth element from said first and second elements.

12. A MEMS device as claimed in claim 1 wherein:
    said second and fourth elements form a movable sense mass;
    said first element is a first fixed sense electrode, wherein a first sense signal is produced between said first fixed sense electrode and said fourth element in response to movement of said sense mass; and said third element is a second fixed sense electrode, wherein a second sense signal is produced between said second fixed sense electrode and said second element in response to said movement of said sense mass, said second sense signal being opposite in polarity from said first sense signal.

13. A microelectromechanical systems (MEMS) device comprising:
a substrate;
a first element and a second element formed in a first structural layer, said first element being fixedly coupled with said substrate, and said second element being suspended over said substrate;
a third element and a fourth element formed in a second structural layer, said third element being spaced apart from said second element in a direction perpendicular to a surface of said substrate, and said fourth element being spaced apart said first element in said direction;
a first junction formed between said second element and said fourth element, said first junction coupling said fourth element with said second element;
an anchor attached to said substrate;
a compliant member interconnected between said second element and said anchor to allow concurrent movement of said second and fourth elements relative to said substrate;
a fifth element formed in said first structural layer and fixedly coupled with said substrate; and
a second junction formed between said third element and said fifth element, said second junction coupling said third element with said fifth element.

14. A MEMS device as claimed in claim 13 wherein said compliant member is connected at an outer edge of said second element such that said second element is a cantilevered structure, and said compliant member enables rotational movement of said second and fourth elements about an axis of rotation that is offset away from said second element.

15. A MEMS device as claimed in claim 13 further comprising a shield interposed between said first and second elements, said shield being configured to electrically isolate said first element from said second element.

16. A microelectromechanical systems (MEMS) accelerometer comprising:
a substrate;
a first electrode and a first portion of a movable sense mass formed in a first structural layer, said first electrode being fixedly coupled with said substrate, and said first portion of said movable sense mass being suspended over said substrate;
a second electrode and a second portion of said movable sense mass formed in a second structural layer, said second electrode being spaced apart from said first portion of said movable sense mass in a direction perpendicular to a surface of said substrate, and said second portion of said movable sense mass being spaced apart from said first electrode in said direction; and
a junction formed between said first and second portions of said movable sense mass, said junction coupling said second portion of said movable sense mass with said first portion of said movable sense mass.

17. A MEMS accelerometer as claimed in claim 16 further comprising:
an anchor attached to said substrate; and a compliant member interconnected between said first portion of said movable sense mass and said anchor to allow concurrent movement of said first and second portions of said movable sense mass relative to said substrate.

18. A MEMS accelerometer as claimed in claim 17 wherein said compliant member is connected to an outer edge of said first portion of said movable sense mass such that said second portion of said movable sense mass is a cantilevered structure, said compliant member enabling rotational movement of said first and second portions of said movable sense mass about an axis of rotation that is offset away from said first portion of said movable sense mass.

19. A MEMS accelerometer as claimed in claim 16 wherein:
said first portion of said movable sense mass includes an opening extending through a thickness of said first portion;
said first electrode resides in said opening; and
said junction comprises a first junction element positioned at a first side of said opening, and a second junction element positioned at a second side of said opening, said first and second junction elements coupling said second portion of said movable sense element with said first portion of said movable sense element so that said second portion of said movable sense element spans across a width of said opening and is suspended over said first electrode.

20. A MEMS accelerometer as claimed in claim 16 wherein said junction is a first junction, and said MEMS accelerometer further comprises:
a fixed element formed in said structural layer and fixedly coupled with said substrate, said fixed element being displaced away from said first portion of said movable sense mass and said first electrode in a lateral direction that is approximately parallel to a surface of said substrate; and
a second junction formed between said second electrode and said fixed element such that said second electrode is a cantilevered structure suspended over said first portion of said movable sense mass.

* * * * *